United States Patent
Beckmann et al.

(10) Patent No.: US 9,617,639 B2
(45) Date of Patent: Apr. 11, 2017

(54) SURFACE-TENSIONED SAPPHIRE PLATE

(71) Applicant: APPLE INC., Cupertino, CA (US)

(72) Inventors: Rudolf Beckmann, Hammersbach (DE); Markus Kress, Muhlheim a.M. (DE)

(73) Assignee: APPLE INC., Cupertino, CA (US)

( * ) Notice: Subject to any disclaimer, the term of this patent is extended or adjusted under 35 U.S.C. 154(b) by 8 days.

(21) Appl. No.: 14/453,065

(22) Filed: Aug. 6, 2014

(65) Prior Publication Data

US 2014/0349092 A1    Nov. 27, 2014

Related U.S. Application Data

(63) Continuation of application No. 14/216,661, filed on Mar. 17, 2014, now abandoned.

(51) Int. Cl.

| | | |
|---|---|---|
| *C23C 16/513* | (2006.01) | |
| *C23C 14/34* | (2006.01) | |
| *C23C 14/58* | (2006.01) | |
| *C03C 17/245* | (2006.01) | |
| *C30B 29/20* | (2006.01) | |
| *C23C 14/08* | (2006.01) | |
| *C23C 16/40* | (2006.01) | |

(52) U.S. Cl.
CPC .......... *C23C 16/513* (2013.01); *C03C 17/245* (2013.01); *C23C 14/081* (2013.01); *C23C 14/34* (2013.01); *C23C 14/582* (2013.01); *C23C 16/403* (2013.01); *C30B 29/20* (2013.01); *Y10T 428/24942* (2015.01); *Y10T 428/265* (2015.01); *Y10T 428/266* (2015.01)

(58) Field of Classification Search
None
See application file for complete search history.

(56) References Cited

U.S. PATENT DOCUMENTS

| | | | |
|---|---|---|---|
| 3,713,877 A | * | 1/1973 | Kirchner et al. ....... C04B 35/01 |
| | | | 427/398.1 |
| 3,736,171 A | | 5/1973 | Kirchner |
| | | | (Continued) |

FOREIGN PATENT DOCUMENTS

| | | |
|---|---|---|
| CN | 102400213 | 4/2012 |
| CN | 102723265 | 10/2012 |
| | (Continued) | |

OTHER PUBLICATIONS

Memering et al, U.S. Appl. No. 61/798,892, filed Mar. 15, 2013.*
(Continued)

*Primary Examiner* — David Sample
(74) *Attorney, Agent, or Firm* — Brownstein Hyatt Farber Schreck, LLP

(57) ABSTRACT

A surface-tensioned sapphire plate and a corresponding manufacturing process. The plate may include a planar sapphire substrate and at least one layer disposed on the surface of the substrate for tensing the substrate. The layer may include at least 50 wt.-% of aluminum oxide (Al2O3). The manufacturing process for producing of a sapphire plate may include providing a planar sapphire substrate, and coating at least one surface of the substrate with a layer tensing the substrate. The layer may include at least 50 wt.-% of aluminum oxide (Al2O3).

16 Claims, 1 Drawing Sheet

(56) References Cited

U.S. PATENT DOCUMENTS

| | | | |
|---|---|---|---|
| 3,809,574 A | 5/1974 | Duffy et al. | |
| 3,859,714 A | 1/1975 | DeLuca | |
| 4,043,638 A | 8/1977 | Kaufmann | |
| 4,339,300 A * | 7/1982 | Noble | C30B 23/02 117/9 |
| 4,675,089 A | 6/1987 | Lory et al. | |
| 5,508,092 A | 4/1996 | Kimock | |
| 5,935,723 A | 8/1999 | Borden | |
| 5,942,343 A | 8/1999 | Chen | |
| 6,012,303 A | 1/2000 | Axelson et al. | |
| 6,440,242 B1 | 8/2002 | Fukazawa | |
| 6,475,820 B2 | 11/2002 | Nakajima et al. | |
| 6,528,123 B1 | 3/2003 | Cadden et al. | |
| 6,627,319 B2 | 9/2003 | Jacquiod et al. | |
| 6,649,494 B2 | 11/2003 | Tamura et al. | |
| 6,827,251 B2 | 12/2004 | Masuda | |
| 6,829,270 B2 | 12/2004 | Suzuki et al. | |
| 6,916,542 B2 | 7/2005 | Buhay et al. | |
| 6,962,759 B2 | 11/2005 | Buhay et al. | |
| 7,112,359 B2 | 9/2006 | Dhar et al. | |
| 7,125,926 B2 | 10/2006 | Satoh et al. | |
| 7,311,961 B2 | 12/2007 | Finley et al. | |
| 7,584,689 B2 | 9/2009 | Jones et al. | |
| 7,592,629 B2 | 9/2009 | Lee et al. | |
| 7,664,469 B2 | 2/2010 | Hutchison | |
| 7,738,187 B2 | 6/2010 | Pazidis et al. | |
| 7,793,580 B2 | 9/2010 | Jones et al. | |
| 7,796,232 B2 | 9/2010 | Park et al. | |
| 7,803,451 B2 | 9/2010 | Lee | |
| 7,966,785 B2 | 6/2011 | Zadesky et al. | |
| 7,998,586 B2 | 8/2011 | Lu et al. | |
| 8,015,970 B2 | 9/2011 | Klun et al. | |
| 8,021,758 B2 | 9/2011 | Sambasivan et al. | |
| 8,025,004 B2 | 9/2011 | Jones et al. | |
| 8,031,174 B2 | 10/2011 | Hamblin et al. | |
| 8,055,003 B2 | 11/2011 | Mittleman et al. | |
| 8,133,599 B2 | 3/2012 | Lu et al. | |
| 8,450,607 B2 | 5/2013 | Du et al. | |
| 8,492,292 B2 | 7/2013 | Yokota et al. | |
| 8,652,658 B2 | 2/2014 | Tatartchenko et al. | |
| 8,685,490 B2 | 4/2014 | Lu et al. | |
| 8,728,634 B2 | 5/2014 | Medwick et al. | |
| 8,790,796 B2 | 7/2014 | Buhay et al. | |
| 8,968,058 B2 | 3/2015 | Kerprich et al. | |
| 8,974,924 B2 * | 3/2015 | Weber | G02B 1/105 428/688 |
| 9,114,487 B2 | 8/2015 | Kiple et al. | |
| 9,115,030 B2 | 8/2015 | Drazenovic | |
| 9,231,155 B2 | 1/2016 | Kuraoka et al. | |
| 9,369,553 B2 | 6/2016 | Zahler et al. | |
| 9,377,912 B2 | 6/2016 | Joyce et al. | |
| 2003/0228476 A1 | 12/2003 | Buhay et al. | |
| 2004/0102229 A1 | 5/2004 | Hutchison | |
| 2006/0051554 A1 * | 3/2006 | Kumakura | C30B 25/18 428/98 |
| 2006/0162849 A1 | 7/2006 | Han | |
| 2007/0048526 A1 | 3/2007 | Hoffman et al. | |
| 2007/0224357 A1 | 9/2007 | Buhay et al. | |
| 2008/0139885 A1 | 6/2008 | Knapp | |
| 2009/0090241 A1 | 4/2009 | Julbe et al. | |
| 2009/0263651 A1 | 10/2009 | Cook | |
| 2010/0027383 A1 | 2/2010 | Suzuki et al. | |
| 2010/0124642 A1 | 5/2010 | Lu et al. | |
| 2011/0155409 A1 | 6/2011 | Du et al. | |
| 2012/0048083 A1 | 3/2012 | Schwerdtfeger et al. | |
| 2012/0172209 A1 | 7/2012 | Lu et al. | |
| 2013/0082358 A1 * | 4/2013 | Aida | C30B 29/20 257/618 |
| 2013/0236699 A1 | 9/2013 | Prest et al. | |
| 2013/0344321 A1 | 12/2013 | McSporran et al. | |
| 2014/0087160 A1 | 3/2014 | McSporran et al. | |
| 2014/0087179 A1 | 3/2014 | Takano et al. | |
| 2014/0116329 A1 | 5/2014 | Chaudhari | |
| 2014/0139978 A1 * | 5/2014 | Kwong | H04M 1/0202 361/679.01 |
| 2014/0193606 A1 | 7/2014 | Kwong | |
| 2014/0272298 A1 | 9/2014 | Memering et al. | |
| 2014/0355126 A1 | 12/2014 | Gutierrez et al. | |
| 2015/0044447 A1 | 2/2015 | Henley | |

FOREIGN PATENT DOCUMENTS

| | | | |
|---|---|---|---|
| DE | 69612997 T2 | | 9/2001 |
| DE | 112004001032 | | 5/2006 |
| JP | 02066159 | | 3/1990 |
| JP | 09008690 | | 1/1997 |
| JP | 2006276617 A | * | 10/2006 |
| JP | 2008111984 | | 5/2008 |
| JP | 2009204404 | | 9/2009 |
| TW | M278556 | | 10/2005 |
| TW | I261247 | | 9/2006 |
| TW | 200948734 | | 12/2009 |
| TW | 201111527 | | 4/2011 |
| TW | M438642 | | 10/2012 |
| WO | WO97/20963 | | 6/1997 |
| WO | WO02/054718 | | 7/2002 |
| WO | WO2009/025842 | | 2/2009 |
| WO | WO2012/088209 | | 6/2012 |
| WO | WO2013/134159 | | 9/2013 |
| WO | WO 2014126777 A | * | 9/2014 |

OTHER PUBLICATIONS

Barbour JD et al., "The mechanical properties of alumina films formed by plasma deposition and by ion irradiation of sapphire," Nuclear Instruments & Methods in Physics Research, Section—B:Beam Interactions with Materials and Atoms, Elsevier, Amsterdam, NL, vol. 166-167, May 1, 2000, pp. 140-147.

Chaudhari, P. et al., Heteroepitaxial Silicon Film Growth at 600C From an Al—Si Eutectic Melt, pp. 5368-5371, Mar. 19, 2010, Thin Solid Films 518, Elsevier, US.

Feng et al., "Strengthening sapphire at elevated temperatures b SiO2 films," Applied Surface Science, Elsevier, Amsterdam, NL, vol. 253, No. 12, Mar. 13, 2007, pp. 5365-5367.

Kirkpatrick A et al., "Effect of Ion Implantation on the Strength of Sapphire at 300-600° C.," Journal of Materials Science, Kluwer Academic Publishers, Dordrecht, vol. 36, No. 9, May 1, 2001, pp. 2195-2201.

Klein, Claude et al., "Flexural strength of sapphire: Weibull statistical analysis of stressed area, surface coating, and polishing procedure effects," Journal of Applied Physics, American Institute of Physics, vol. 96, No. 6, Jan. 1, 2004, 8 pages.

Kobrin, P.H. et al., "Compressive thin films for increased fracture toughness," Proceedings of SPIE, vol. 683, Jan. 1, 1986-Aug. 19, 1986, 5 pages.

Liu, C.M. et al., "The effect of annealing, precipitation-strengthening, and compressive coating processes on sapphire strength," Materials Science and Engineering A: Structural Materials: Properties, Microstructure & Processing, Lausanne, Switzerland, vol. 420, No. 1-2, Mar. 25, 2006, 8 pages.

Patscheider, Jorg et al., "Plasma-Induced Deposition of Thin Films of Aluminum Oxide," Plasma Chemistry and Plasma Processing, Plenum Press, New York, US, vol. 12, No. 2, Jun. 1, 1992, 17 pages.

Seman, Michael T. et al., "An Analysis of the Deposition Mechanisms involved during Self-Limiting Growth of Aluminum Oxide by Pulsed PEVCD," Chemical Vapor Deposition, Wiley-VCH Verlag, Weinheim, Germany, vol. 14, No. 9/10, Sep. 1, 2008, 7 pages.

Simpson, Todd W. et al., "Kinetics of the Amorphous → γ → α Transformations in Aluminum Oxide: Effect of Crystallographic Orientation," Journal of the American Ceramic Society, vol. 81, No. 1, Jan. 1, 1998, 6 pages.

International Search Report and Written Opinion, PCT Application No. PCT/EP2014/054819, 12 pages, Apr. 30, 2014.

International Search Report and Written Opinion, PCT Application No. PCT/EP2014/054820, 11 pages, Apr. 30, 2014.

(56) References Cited

OTHER PUBLICATIONS

International Search Report and Written Opinion, PCT Application No. PCT/US2013/060989, 10 pages, Feb. 5, 2014.
International Search Report and Written Opinion, PCT Application No. PCT/US2013/066193, 11 pages, Jan. 20, 2014.
International Search Report and Written Opinion, PCT Application No. PCT/US2014/029026, 15 pages, Jul. 30, 2014.
U.S. Appl. No. 13/679,493, filed Nov. 16, 2012, Kelvin Kwong.
U.S. Appl. No. 14/033,890, filed Sep. 23, 2013, Douglas Weber et al.
U.S. Appl. No. 14/214,163, filed Mar. 14, 2014, Dale N. Memering et al.
U.S. Appl. No. 14/453,102, filed Aug. 6, 2014, Rudolf Beckmann et al.
Juropol's 2 Sapphire Crystal Ingot Specification (2014): http://www.juropol.eu/_files/pdf/2_inchingot_Specification_juropol.pdf.
Schmid et al., Effect of Crystal Orientation and Temperature on the Strength of Sapphire, Journal of the American Ceramic Society, 80, 1998, pp. 885-893.
Morris, Jr., J.L., "A Survey of Materials Science I. Structure," Chapter 4, pp. 79-109, Fall 2007.

\* cited by examiner

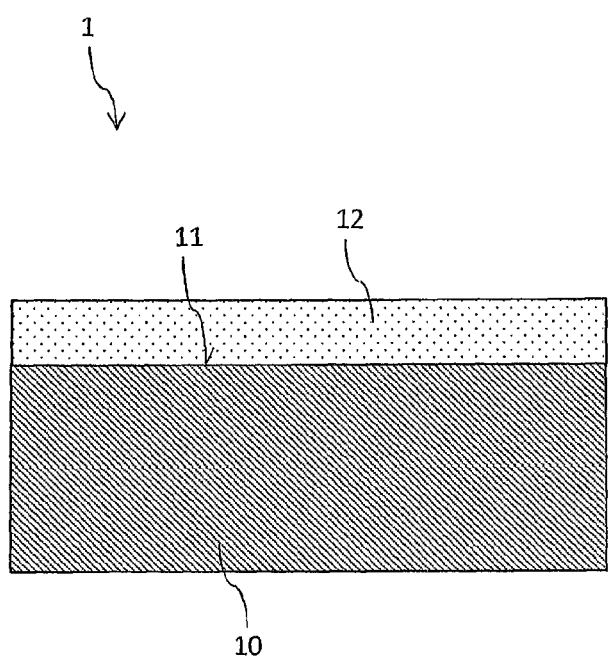

SURFACE-TENSIONED SAPPHIRE PLATE

CROSS-REFERENCE TO RELATED APPLICATIONS

This application is a continuation patent application of U.S. patent application Ser. No. 14/216,661, filed Mar. 17, 2014, and titled "Surface-Tensioned Sapphire Plate," which claims priority to German Patent Application No. 10 2013 004 558.4, filed Mar. 18, 2013, and titled "Surface-Tensioned Sapphire Plate," the disclosures of which are incorporated herein by reference in their entireties.

TECHNICAL FIELD

Embodiments described herein relate to a surface-tensioned sapphire plate which is in particular intended to be used as a cover for display devices. Furthermore, embodiments relate to a method for producing said surface-tensioned sapphire plate.

BACKGROUND

Mono-crystalline sapphire is characterized by an extraordinary hardness and stretch resistance. Sapphire plates, generally referred to as sapphire glass, are therefore frequently used in the watch industry. It is desirable to broaden the scope of application of sapphire plates and to use them as transparent covers for display devices of electronic devices. It is generally conceivable to equip electronic displays, for example of tablet computers, mobile phones and smartphones, with sapphire plates.

However, due to its crystalline properties, in particular the mono-crystalline structure, sapphire is relatively brittle. Relatively large and thin sapphire plates, as would be required for example as covers for smartphones of tablet computers, therefore have a break resistance during bending and heavy impact, which is insufficient for practical application.

For production reasons, the surface of sapphire plates typically has defects and/or micro-cracks. Such micro-cracks can propagate relatively fast in the plate material during bending or heavy impact and can ultimately lead to breaking of the sapphire plate.

In the publication of C. M. Liu, J. C. Chen, L. J. Hu, S. P. Lin "The effect of annealing, precipitation-strengthening, and compressive coating processes on sapphire strength", Material Science and Engineering A 420 (2006) 212-219, the hardening of sapphire by means of tempering is described, among others, during which the sapphire plates are heated up to temperatures of at least 1500° C. for a relatively long time, i.e. approximately 24 hours.

Surface defects can be removed. However, the method takes a relatively long time as well as being cost-intensive and energy-intensive. Furthermore, the coating of sapphire substrates with silicon nitride is described as an anti-reflection coating. Due to the subsequent thermal hardening process, to which the coating is subjected for at least an hour at a temperature of 1500° C., the applied silicon nitride layer can crystallize.

Since silicon nitride has a higher density in the crystalline state than in the amorphous state, a compressive stress can be generated on the sapphire surface. As a result, the micro-cracks or defects present on the surface bordering with the applied silicon nitride layer can virtually be pulled together and therefore be minimized. The sapphire plate can therefore be tensioned or pre-tensioned by the coating.

The refractive index of a silicon nitride layer is typically above 1.9. The refraction index of pure silicon nitride is even 1.98. In contrast, mono-crystalline sapphire has an average refraction index of 1.74 in the range of the visible spectrum. The silicon nitride layer alters the optical properties of a sapphire plate.

Consequently, silicon nitride is highly reflective and has a reflectance on sapphire of more than 30%, so that it can generally not be used for coating of cover plates of display devices.

SUMMARY

By contrast, embodiments disclosed herein may increase the impact resistance and breaking resistance of a sapphire substrate or a sapphire plate, respectively, while influencing the optical properties of the sapphire plate, or may take the form of such a plate. In particular, with regard to optical transmission and reflection in the range of the visible spectrum, certain embodiments change these properties as little as possible. Embodiments may likewise provide an efficient and streamlined method for hardening sapphire plates, which is suitable for industrial mass production.

One embodiment may take the form of a surface-tensioned sapphire plate comprising: a planar sapphire substrate; and at least one layer disposed on the surface of the substrate tensing the substrate, wherein the layer has at least 50 wt.-% of aluminum oxide (Al2O3).

Another embodiment may take the form of a method for producing of a sapphire plate, the method comprising: providing a planar sapphire substrate; and coating at least one surface of the substrate with a layer tensing the substrate; wherein the layer comprises at least 50 wt.-% of aluminum oxide (Al2O3).

BRIEF DESCRIPTION OF THE DRAWINGS

The disclosure will be readily understood by the following detailed description in conjunction with the accompanying drawings, wherein like reference numerals designate like structural elements, and in which:

FIG. 1 shows a schematic cross section of a surface-tensed sapphire plate according to embodiments.

It is noted that the drawings are not necessarily to scale. The drawings are intended to depict only typical aspects of embodiments, and therefore should not be considered as limiting the scope of the embodiments. In the drawings, like numbering represents like elements between the drawings.

DETAILED DESCRIPTION

This task is solved with a surface-tensioned sapphire plate according to embodiments, as well as with a method to produce such a sapphire plate according to embodiments.

Accordingly, a surface-tensioned sapphire plate is provided which has a planar sapphire substrate and at least one layer arranged on one surface of the substrate. The layer here is used to generate the tension of the sapphire substrate. Certain embodiments may be qualified and suited to perform a compressive stress on the respective surface of the substrate which faces the layer.

In at least one non-limiting example, the layer here has at least 50 wt.-% aluminum oxide (Al2O3). Since sapphire substantially contains crystalline aluminum oxide, applying a layer having a high amount of aluminum oxide to a sapphire substrate alters its optical properties marginally, at the most.

It initially seems to be counter-intuitive to apply an aluminum oxide layer to a sapphire substrate. However, experiments have shown, that by coating the sapphire substrate with a layer having at least 50 wt.-% of aluminum oxide, the break resistance, the impact resistance, as well as the bending strength of the sapphire substrate increases. Thus, the physical properties of the sapphire substrate and/or the sapphire plate with the at least one layer may be increased significantly in comparison to the uncoated sapphire substrate.

Due to the high amount of aluminum oxide in the layer applied to the sapphire substrate, the optical properties of the sapphire substrate are altered, if at all, only negligibly.

According to a further embodiment, the layer comprises amorphous aluminum oxide. This has a higher thermal expansion coefficient in comparison to a crystalline aluminum oxide, i.e. in comparison to sapphire. Since the coating process is done at significantly elevated temperatures compared to room temperature, approximately in the range from 300° C. to 500° C., in particular in the range of approximately 400° C., the applied layer contracts during cooling of the coated sapphire plate significantly more than the sapphire substrate.

In this manner, permanent compressive stress can be induced on the surface of the substrate facing the layer, thereby being able to eventually provide a surface-tensioned sapphire plate with an elevated bending strength, as well as an elevated break resistance.

Compressive stress cannot only be generated by different thermal expansion coefficients between the layer and the sapphire substrate, but also by the coating process itself. Depending on the intended coating process, in particular during a sputtering process, the layer to be formed on the substrate can be mechanically compressed by ion bombardment which leads to a compressive stress within the applied layer itself. Due to its connection with the substrate surface, the tensioned layer can transfer a corresponding compressive stress to the sapphire substrate.

In combination with the thermally caused, compressive stress effect, the compressive stress applied to the substrate can be raised even further.

According to other embodiments, the layer applied to the sapphire substrate has a layer thickness of: at least 100 nm, at least 200 nm, at least 300 nm, at least 500 nm, at least 750 nm, at least 1000 nm, at least 1100 nm or at least 1500 nm. In certain embodiments, a layer thickness in the range of 1 µm and above can significantly raise the breaking resistance as well as the bending flexibility of the surface-tensioned sapphire plate compared to an uncoated sapphire substrate.

According to an embodiment of the sapphire plate, the coated surface of the sapphire substrate extends substantially parallel to the C axis of the crystalline substrate. Since sapphire furthermore has a smaller thermal expansion coefficient in the direction vertical to the C axis than parallel to it, the greatest possible difference of the thermal expansion coefficients of the layer and the substrate can be used due to the substrate's crystal orientation.

This crystal orientation may be useful as the thermal expansion coefficient of sapphire perpendicular to the C axis is $5 \times 10-8/K$. This thermal expansion coefficient is smaller than the one of amorphous aluminum oxide, which is in the range of $8 \times 10-6/K$.

It is to be furthermore understood that the thermal expansion coefficient of sapphire and/or of the layer to be applied may be subject to a temperature dependency. This can lead to variable boundary conditions for the coating process, in particular for the coating temperature. The crystal orientation, the layer composition and the coating temperature may be adjusted such that the sapphire substrate receives an elevated or maximum compressive stress after cooling down to room temperature.

Such temperature ranges should be avoided in which the layer might have a lower thermal expansion coefficient than the sapphire substrate. This results in coating temperatures below 600° C. being unsuitable in certain embodiments and depending on certain conditions.

Due to the provided crystal orientation, a largest possible difference can additionally be achieved with regard to the thermal expansion coefficients of the sapphire substrate and the layer applied on it. In this manner, a thermally induced largest possible compressive stress can be provided for the sapphire plate.

According to a further embodiment, the layer applied to the sapphire substrate substantially comprises aluminum oxide. It can also substantially consist of aluminum oxide. It is, however, also conceivable, due to the respective coating process, that the layer applied to the sapphire substrate also comprises other components or materials.

In some embodiments, but not necessarily in all, the layer comprises at least 60 wt.-% of aluminum oxide, at least 70 wt.-% of aluminum oxide, at least 80 wt.-% of aluminum oxide or even more than 90 wt.-% of aluminum oxide.

According to a further embodiment, besides aluminum oxide, the layer may comprise carbon, hydrogen and/or nitrogen. In particular, the layer can comprise 0 to 5 wt.-% of carbon, 0 to 10 wt.-% of hydrogen and/or 0 to 5 wt.-% of nitrogen. These additional materials in the layer are intrinsically included in the layer due to the coating processes.

If, for example, a plasma-assisted chemical steam separator method, a so-called plasma-CVD process, is used to apply the layer, an aluminum oxide deposition on the sapphire substrate can occur especially efficiently with relatively high deposition rates by supplying trimethylaluminum (TMA) and nitrous oxide. The plasma generation which takes place in a plasma reactor at a predetermined temperature and a predetermined pressure, and the corresponding chemical reaction, can lead to the inclusion of carbon, hydrogen and/or nitrogen parts in the applied layer.

According to a further embodiment, the layer applied to the sapphire substrate is substantially transparent for electromagnetic radiation in the visible wavelength range. Substantially transparent here means a transmittance of at least 80%, 85% or of at least 90%.

In a further aspect, one or more embodiments further relates to a method for producing a surface-tensioned sapphire plate. In a first method step, a planar sapphire substrate is provided which, in a subsequent step, is provided, in particular coated, with a substrate-tensing layer. At least one surface of the substrate is thereby coated with a substrate-tensing layer. The layer formed to induce compressive stress on the substrate comprises at least 50 wt.-% of aluminum oxide, in particular amorphous aluminum oxide.

This results in the previously described advantages with regard to the breaking resistance and bending flexibility of the sapphire plate, which was surface-tensioned by means of the applied layer.

Optionally, the provided planar sapphire substrate can be subjected to a thermal pretreatment prior to the coating process, such as tempering or annealing. Thereby, any micro-cracks of the substrate possibly present on the substrate surface can at least be closed zonally, and/or at least be minimized.

According to a further embodiment, the layer is applied to the substrate with the assistance of plasma. For this purpose, the substrate is inserted into a plasma treatment chamber, in which a plasma is ignited at a predetermined pressure and a predetermined temperature by introducing at least one or more process gases and by providing energy. Reaction products of the reaction gases inserted into the plasma treatment chamber can be deposited on the surface of the substrate and can therefore form the surface-tensioned layer on the substrate.

According to a further embodiment, the layer can also be applied to the surface of the substrate by way of a sputtering process. A sputtering target may be subjected to ion bombardment, whereby target ions are ejected from the target and are finally deposited on the surface of the substrate. Here, certain embodiments use a ceramic aluminum oxide target or an aluminum target. When using an aluminum target, oxygen or gases containing oxygen, respectively, may be provided in the corresponding reaction chamber to facilitate the formation of aluminum oxide and its deposition on the substrate surface.

According to a further embodiment, the layer is applied to the substrate by way of a plasma-assisted CVD process. Hereby, in particular a PECVD method (Plasma-Enhanced-Chemical-Vapor-Deposition) is used.

For the plasma-assisted CVD process according to a further embodiment, in particular trimethylaluminum (TMA) and nitrous oxide are used as reaction gases. In some embodiments, the reaction gases trimethylaluminum (TMA) and nitrous oxide are used here in a ratio of at the most 1/2, 1/4, 1/8, 1/16, 1/24 or 1/32. This means that for one part of TMA, there are at least 32 parts of nitrous oxide. The ratio mentioned herein specifies the ratio of the amounts of substance inserted into a plasma reactor per unit of time. Other embodiments may use different ratios.

Generally, using a trimethylaluminum to nitrous oxide ratio of approximately 1/16 in a plasma CVD process generates excellent surface-tensioned layers on the sapphire substrate which substantially increases the breaking resistance and bending flexibility of the entire sapphire plate in comparison to the uncoated sapphire substrates. Additionally, the ratio discussed above (e.g., approximately 1/16) substantially increases the breaking resistance and bending flexibility of the entire sapphire plate in comparison to the coated sapphire substrates, which were generated using a different reaction gas ratio.

Using a reaction gas mixture of 16 nitrous oxide parts for each trimethylaluminum part also proves to be especially useful for the scratch resistance of the applied layer. The scratch resistance of a layer generated with a process gas mixture ratio of 1/16 is typically better than the scratch resistance of layers generated with other process gas mixture ratios, examples of which include, 1/8 and 1/32.

In the following description of an embodiment, additional features of the particular embodiment will be explained with reference to the drawing. FIG. 1 shows a schematic cross section of a surface-tensed sapphire plate.

The sapphire plate shown in FIG. 1 comprises a planar sapphire substrate 10 whose planar surface 11 is provided with a surface-tensioned layer 12. The layer 12 applied to the sapphire substrate 10 has at least 50 wt.-% of aluminum oxide and can apply a compressive stress on the substrate 10 due to intrinsic, i.e. layer-internal mechanical stress, but also due to a thermal expansion coefficient which is different and in particular higher than that of sapphire substrate 10.

Any micro cracks inevitably present in the border area between substrate 10 and the applied layer 12 on the side of the substrate can be pressed together this way.

Applying a compressive stress to the surface 11 of substrate 10 means that surface 11 is contracted horizontally.

It is particularly provided here that the mono-crystalline sapphire substrate 10 typically has a thickness of 0.2 mm to 2 mm, of 0.3 to 1.5 mm or of 0.5 mm to 1 mm, while the thickness of the layer is at least 100 nm, 200 nm, 300 nm, 500 nm, 750 nm, 1000 nm, 1100 nm or at least 1500 nm. Certain embodiments may have, or may provide, a layer thickness of 1 µm on a sapphire substrate of a thickness of less than 1 mm. In particular, a layer of a thickness of 1 µm can be applied to sapphire substrates with a substrate thickness of, for example, 0.4 mm. Such substrate layer thickness ratios prove to be especially advantageous for an efficient and good surface tension.

Sapphire substrate 10 is oriented in parallel with its crystallographic A or C axis to the surface normal of the planar surface 11, such that, under consideration of the temperature-dependent thermal expansion coefficients of the layer and the substrate, as well as under consideration of the coating temperature of the layer, a highest possible compressive stress applies to the substrate. Depending on process conditions, either the crystalline A axis or the C axis of the mono-crystalline sapphire substrate 10 can run along the coated substrate surface 11 and it can coincide with the border layer between substrate surface 11 and coating 12.

Assuming temperature-independent thermal expansion coefficients, sapphire has a thermal expansion of 5×10-6/K at room temperature along the A axis, while amorphous aluminum oxide has a thermal expansion coefficient of 8×10-6/K.

Due to the relatively high amount of aluminum oxide in the applied layer 12 and due to applying the layer 12 by way of sputtering or by way of a plasma-assisted steam deposition process, applying of the layer occurs at a relatively high temperature. For example, layer 12 may be applied at temperatures between 350° C. and 450° C., and in particular at a temperature of, for example, approximately 400° C. in one embodiment. Due to the cooling down process following the coating process, and due to the different thermal expansion coefficients of the sapphire substrate 10 and the layer 12, which comprises aluminum oxide, a compressive stress can be applied to the sapphire substrate 10. As a result, the sapphire plate 1 formed by sapphire substrate 10 and layer 12, includes increased breaking resistance and bending flexibility.

In addition to the different expansion coefficients, the coating method itself, in particular by sputtering of the layer, may also provide intrinsic mechanic stress within layer 12, which ultimately leads to a further increase of the compressive stress applied to substrate 10 and/or sapphire plate 1.

Additionally, a so-called refractive power adjustment layer can be inserted in the layer between the substrate and the tensioned aluminum oxide layer for optical reasons to avoid interference phenomena due to the different refractive powers of the layer and the substrate. This layer can also include aluminum oxide, wherein the refractive power of this intermediate layer should be between the refractive power of the sapphire substrate and the refractive power of the layer. The thickness of this intermediate layer can typically be between 60 nm and 100 nm, preferably 80 nm.

We claim:

1. A surface-tensioned sapphire plate comprising:
   a planar sapphire substrate;
   at least one layer disposed on the surface of the substrate and exhibiting a residual tensile stress;
   wherein the layer has at least 50 wt.-% of aluminum oxide (Al2O3).

2. The sapphire plate of claim 1, wherein the layer comprises amorphous aluminum oxide (Al2O3).

3. The sapphire plate of claim 1, wherein the layer has a layer thickness of one of at least: 100 nm, 200 nm, 300 nm, 500 nm, 750 nm, 1000 nm, 1100 nm or 1500 nm.

4. The sapphire plate of claim 1, wherein an interface surface of the sapphire substrate substantially coincides with the A axis crystalline orientation of sapphire or the C axis crystalline orientation of sapphire, the interface surface disposed adjacent the at least one layer.

5. The sapphire plate of claim 1, wherein the layer substantially comprises aluminum oxide (Al2O3) or substantially consists of aluminum oxide (Al2O3).

6. The sapphire plate of claim 1, wherein the layer comprises at least one of:
0 to 5 wt.-% of carbon,
0 to 10 wt.-% of hydrogen, and
0 to 5 wt.-% of nitrogen.

7. The sapphire plate of claim 6, wherein the layer includes at least 80 wt.-% of aluminum oxide (Al2O3).

8. The sapphire plate of claim 1, wherein the layer is substantially transparent to electromagnetic radiation in a visible wavelength range.

9. The sapphire plate of claim 1, wherein the planar sapphire substrate includes a thickness of 0.2 mm to 2 mm.

10. The sapphire plate of claim 1, wherein the sapphire substrate includes a first thermal expansion coefficient, and
the layer includes a second thermal expansion coefficient, distinct from the first thermal expansion coefficient of the sapphire substrate.

11. A surface-tensioned sapphire plate, comprising:
a sapphire structure having a first thermal expansion coefficient;
a layer adhered to the sapphire structure and having a second thermal expansion coefficient; and
wherein:
the layer has at least 50 wt.-% of aluminum oxide (Al2O3); and
the second thermal expansion coefficient is greater than the first thermal expansion coefficient.

12. The sapphire plate of claim 11, wherein the layer comprises amorphous aluminum oxide (Al2O3).

13. The sapphire plate of claim 11, wherein the layer comprises at least one of:
0 to 5 wt.-% of carbon,
0 to 10 wt.-% of hydrogen, and
0 to 5 wt.-% of nitrogen.

14. A surface-tensioned sapphire plate, comprising:
a sapphire sheet having a first surface with a number of surface defects;
a layer affixed to the first surface, the layer comprising at least 50 wt.-% of aluminum oxide (Al2O3); and
wherein the layer is configured to induce a compressive stress within the sapphire sheet to press together at least one of the surface defects.

15. The sapphire plate of claim 14, wherein the layer comprises amorphous aluminum oxide (Al2O3).

16. The sapphire plate of claim 14, wherein the layer comprises at least one of:
0 to 5 wt.-% of carbon,
0 to 10 wt.-% of hydrogen, and
0 to 5 wt.-% of nitrogen.

* * * * *